(12) United States Patent
Li et al.

(10) Patent No.: US 11,631,642 B2
(45) Date of Patent: Apr. 18, 2023

(54) METHOD FOR MANUFACTURING SEMICONDUCTOR DEVICE

(71) Applicant: Winbond Electronics Corp., Taichung (TW)

(72) Inventors: Shu-Ming Li, Taichung (TW);
Chia-Hung Liu, Taichung (TW);
Tzu-Ming Ou Yang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 17/537,518

(22) Filed: Nov. 30, 2021

(65) Prior Publication Data

US 2022/0093511 A1 Mar. 24, 2022

Related U.S. Application Data

(62) Division of application No. 16/709,896, filed on Dec. 10, 2019, now Pat. No. 11,217,527.

(51) Int. Cl.
*H01L 23/528* (2006.01)
*H01L 21/311* (2006.01)
*H01L 21/768* (2006.01)

(52) U.S. Cl.
CPC .... *H01L 23/5283* (2013.01); *H01L 21/31116* (2013.01); *H01L 21/76804* (2013.01); *H01L 21/76897* (2013.01)

(58) Field of Classification Search
CPC ........... H01L 23/5283; H01L 21/31116; H01L 21/76804; H01L 21/76897
See application file for complete search history.

(56) References Cited

U.S. PATENT DOCUMENTS 6,693,360 B1 * 2/2004 Dei ..................... H01L 23/485
257/773

* cited by examiner

*Primary Examiner* — Shahed Ahmed
*Assistant Examiner* — Vicki B. Booker
(74) *Attorney, Agent, or Firm* — JCIPRNET

(57) ABSTRACT

A method for manufacturing a semiconductor device includes forming contacts disposed in a dielectric layer. The method of forming the contacts includes forming contact holes and then filling with a conductive material. The method of forming the contact holes includes steps of forming openings in the dielectric layer to expose active regions, introducing a first oxygen plasma and a first fluorine plasma to remove by-products and oxidize inner surfaces of the openings, introducing a second oxygen plasma and a second fluorine plasma to remove the oxidized inner surfaces and repair the active regions, introducing a third oxygen plasma to oxidize inner surfaces again to form an oxide layer, and removing the oxide layer. The cross-sectional structure of two adjacent contact holes includes a capital, a base, and a shaft between the capital and the base, wherein the shaft has a smaller width than the base and the capital.

14 Claims, 10 Drawing Sheets

METHOD FOR MANUFACTURING SEMICONDUCTOR DEVICE

CROSS-REFERENCES TO RELATED APPLICATIONS

This application is a divisional application of and claims the priority benefit of U.S. patent application Ser. No. 16/709,896, filed on Dec. 10, 2019, now allowed as U.S. Pat. No. 11,217,521. The entirety of the above-mentioned patent application is hereby incorporated by reference herein and made a part of this specification.

BACKGROUND

Technical Field

The present invention relates to a semiconductor technology, and more particularly, to a method for manufacturing a semiconductor device having a contact with a specific structure.

Description of Related Art

With the miniaturization of the new generation semiconductor process, the sizes of the various components of semiconductor devices will be relatively reduced. For example, the size of the contacts of semiconductor devices is reduced, and the distance between the contacts also is reduced. Therefore, in order to break through the limitation of the light source resolution in the lithography process, a self-alignment double patterning (SADP) process currently is used to reduce the size of the contact.

However, for the traditional lithography and etching process and the above-mentioned SADP process, the contact area between the contact and the substrate or other components may be reduced due to the alignment error caused by the initial lithography process, thereby affecting performance of the device.

SUMMARY

The present invention provides a method for manufacturing a semiconductor device. The semiconductor device has a contact with a specific structure, such that the contact area between the contact and the active region can be increased, thereby improving the electrical properties of the device.

The method for manufacturing a semiconductor device of the present invention includes the following steps. A plurality of active regions are defined in a substrate. At least one dielectric layer is formed on the substrate. A plurality of openings are formed in the dielectric layer to expose the active regions. A first oxygen plasma and a first fluorine plasma are introduced to remove by-products in the openings and oxidize the inner surfaces of the openings. A second oxygen plasma and a second fluorine plasma are introduced to remove the oxidized inner surfaces for enlarging the openings and to repair the active regions. A third oxygen plasma is introduced to oxidize the inner surfaces of the enlarged openings to form an oxide layer. The oxide layer is removed to form a plurality of contact holes, wherein the cross-section structure of two adjacent contact holes includes a capital, a base, and a shaft between the capital and the base, and the width of the shaft is smaller than the width of the base, and the width of the shaft is also smaller than the width of the capital. A conductive material is deposited on the substrate and fills the contact holes. The conductive material is then planarized to form a plurality of contacts in the contact holes.

Based on the above, the method of the present invention can form a plurality of contacts each with a specific structure, each contact with a specific structure is slightly barrel-shaped, and the distance between two adjacent contacts each with a specific structure is smaller than the distance between two adjacent conventional contacts generally formed by a lithography and etching process or a SADP process, which means that the contact area between each contact with a specific structure and the substrate is larger. Accordingly, the electrical properties of the device can be improved. In addition, even if there is a bit of the alignment error between the contact and the active region, it does not affect the electrical connection.

In order to make the aforementioned features and advantages of the disclosure more comprehensible, embodiments accompanied with figures are described in detail below.

DESCRIPTION OF THE EMBODIMENTS

Figure 1:
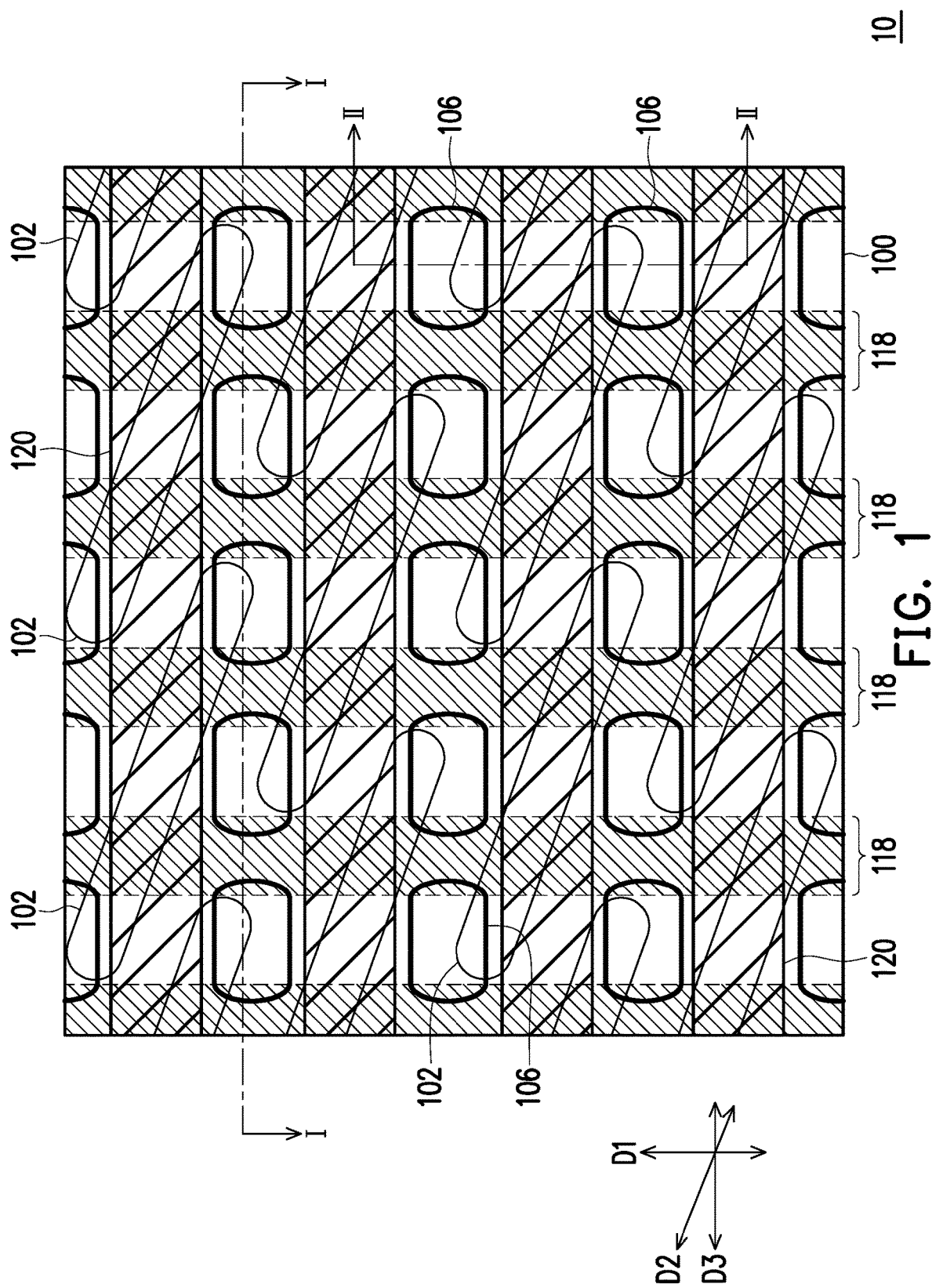
FIG. 1 is a schematic top view of a semiconductor device according to an embodiment of the present invention.

The embodiments of the disclosure are described more fully hereinafter with reference to the accompanying drawings, but the disclosure may be embodied in many other different forms, and the invention should not be construed as limited to the recited embodiments. In addition, "first", "second", "third" . . . etc. are used to describe different stages in the process or different regions, films and/or blocks in the structure, and such terms have a sequential meaning in terms of process, but in terms of structure, such terms are only intended to differentiate a region, film, or block from another region, film, or block. For clarity, in the drawings, the relative sizes and locations of each film, region and/or structural component could be reduced or enlarged. In addition, the same or similar reference numerals indicate the same or similar components, and thus the same or similar descriptions will not be repeated in the following paragraphs.

Figure 2A:
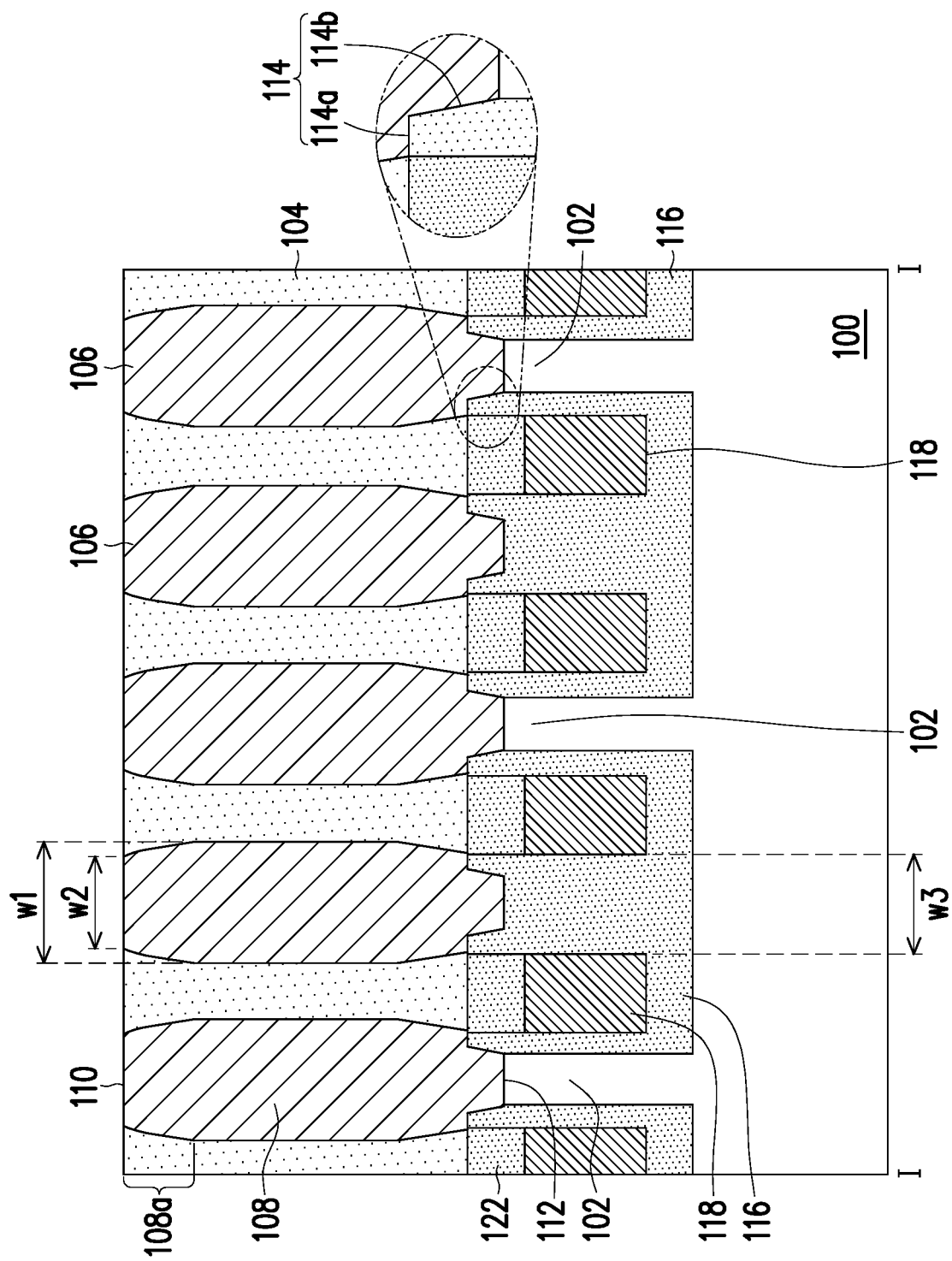
FIG. 2A is a schematic cross-sectional view taken along the line I-I in FIG. 1.
Figure 2B:
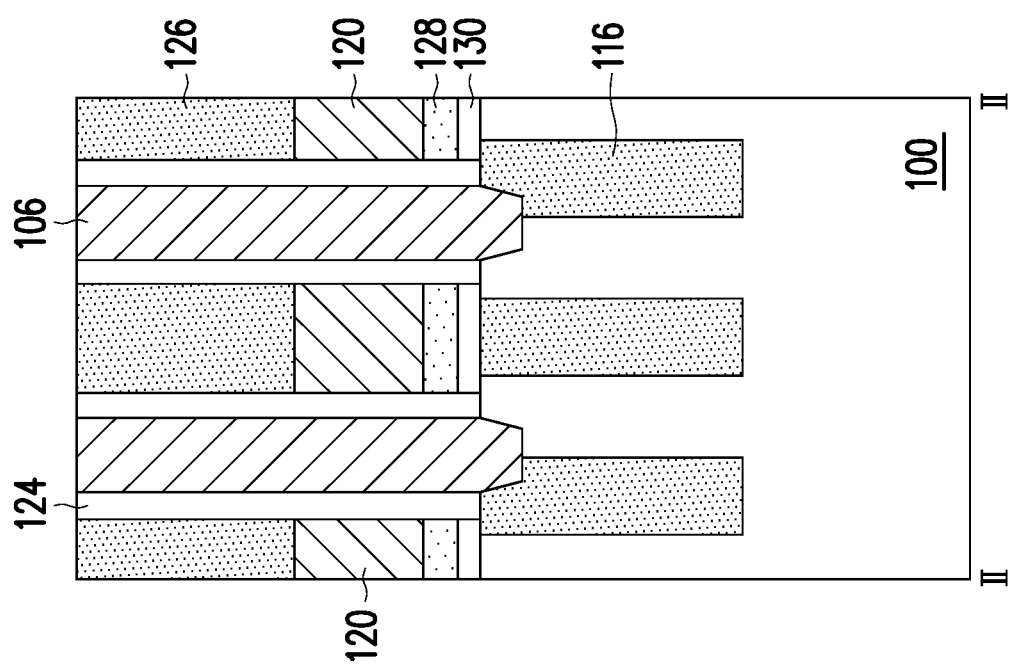
FIG. 2B is a schematic cross-sectional view taken along the line II-II in FIG. 1.

FIG. 1 is a schematic top view of a semiconductor device according to an embodiment of the present invention, and some components such as a dielectric layer are omitted for clarity. FIG. 2A is a schematic cross-sectional view of the line I-I in FIG. 1. FIG. 2B is a schematic cross-sectional view of the line II-II in FIG. 1.

Referring to FIG. 1 and FIG. 2A, the semiconductor device 10 of this embodiment includes a substrate 100 having a plurality of active regions 102, at least one dielectric layer 104 and a plurality of contacts 106. The dielectric layer 104 is formed on the substrate 100. The contacts 106 are located in the dielectric layer 104 and are connected to the active regions 102, and capacitor structures (not shown) are subsequently formed above and to connect with the contacts 106. Each contact 106 is a barrel-shaped structure, which has a middle portion 108, a head portion 110 and an end portion 112, and the end portion 112 directly contacts the corresponding active region 102. The perimeter of the head portion 110 is smaller than the perimeter of the middle portion 108, the perimeter of the end portion 112 is also smaller than the perimeter of the middle portion 108, and the perimeter of the head portion 110 may be greater than or equal to the perimeter of the end portion 112. The "perimeter" in the text generally refers to the perimeter of the widest part. In addition, the portion 108a of the middle portion 108 that is close to the head portion 110 may have a width that tapers toward the head portion 110. For example, the width reduction ratio of the portion 108a of the middle portion 108 near the head portion 110 (i.e., the difference between the width w1 of the middle portion 108 and the width w2 of the portion 108a divided by the width w1 of the middle portion 108) is about between 10% and 25%, preferably between 12% and 16%. Moreover, the middle portion 108 of this embodiment may have a stepped cross section 114 close to the end portion 112, where the stepped cross section 114 includes a bottom 114a and a sidewall 114b, and the sidewall 114b connects the bottom 114a and the end portion 112 of the barrel-shaped structure. In some embodiments, the maximum width w3 of the stepped cross section 114 is 2.5 times or less the width w2 of the head portion 110, preferably 1.66 times or less the width w2 of the head portion 110. In some embodiments, the material of the contact 106 is, for example, doped or undoped polycrystalline silicon, titanium nitride, tungsten, the like, or a combination thereof.

Next, referring to FIG. 1, FIG. 2A and FIG. 2B, in an embodiment taking a memory device as an example, the semiconductor device 10 may further include an isolation structure 116 defining the active regions 102 in the substrate 100, a plurality of buried word lines 118 extending along a first direction D1 and arranged along a third direction D3, and a plurality of bit lines 120 extending along the third direction D3 and arranged along the first direction D1. The isolation structure 116 may be a shallow trench isolation structure (STI) or a deep trench isolation structure (DTI). The first direction D1 is interlaced with the third direction D3. For example, the first direction D1 may be substantially orthogonal to the third direction D3. In addition, the active region 102 extends along a second direction D2. The second direction D2 is interlaced with the first direction D1 and the third direction D3. In an embodiment, an included angle between the second direction D2 and the third direction D3 ranges from 30° to 45°.

In FIG. 2A, the buried word line 118 penetrates a part of the isolation structure 116 and a cover layer 122 is disposed on the head portion of the buried word line 118 to block the buried word line 118 from the structure above it. In addition, a gate dielectric layer (not shown) may be provided between the buried word line 118 and the isolation structure 116. The material of the buried word line 118 is, for example, doped or undoped polycrystalline silicon, tungsten, the like, or a combination thereof.

As shown in FIG. 2B, the contact 106 is located between two bit lines 120. In addition, as shown in FIG. 2B, spacers 124 are formed on the sidewalls of the bit line 120, a cover layer 126 is formed on the head portion of the bit line 120, and these structures can be used to protect the bit line 120 and isolate the bit line 120 from the contact 106. Moreover, because the distance between adjacent bit lines 120 is small in FIG. 2B, the side surfaces of the contact 106 shown in FIG. 2B are different from that shown in FIG. 2A; however, if the distance between adjacent bit lines 120 is large enough in FIG. 2B, then a width between the side surfaces of the contact 106 may taper toward the head portion as shown in FIG. 2A. In addition, an insulating layer 128 and a dielectric layer 130 may be provided between the substrate 100 and the bit lines 120, but the present invention is not limited thereto. The material of the bit line 120 is, for example, doped or undoped polycrystalline silicon, tungsten, the like, or a combination thereof.

In some embodiments, the substrate 100 may be a semiconductor substrate or a semiconductor on insulator (SOI) substrate. Semiconductor materials in the semiconductor substrate or the SOI substrate may include elemental semiconductor materials, alloy semiconductor materials, or compound semiconductor materials. For example, the elemental semiconductor materials may include Si or Ge, the alloy semiconductor materials may include SiGe, SiC, or SiGeC, and the compound semiconductor materials may include III-V semiconductor materials or II-VI semiconductor materials. In some embodiments, the substrate 100 may be doped to render a first conductive type or a second conductive type complementary to the first conductive type. For example, the first conductive type may be N type and the second conductive type may be P type. In some embodiments, the material of the isolation structure 116 in the substrate 100 is an insulating material, such as silicon oxide, silicon nitride, silicon oxynitride, the like, or a combination thereof.

In addition, the dielectric layer 104 on the substrate 100 is made of an insulating material, such as silicon oxide, silicon nitride, silicon oxynitride, the like, or a combination thereof. In some embodiments, the dielectric layer 104 may have a single-layer structure, and the material of the single-layer structure may include silicon oxide or other low-k dielectric materials (e.g., dielectric materials with a dielectric constant lower than 4). In some alternative embodiments, the dielectric layer 104 may be a multilayer structure. For example, the dielectric layer 104 may be a multilayer structure composed of silicon oxide, silicon nitride, or other dielectric materials. In addition, in other embodiments, the dielectric layer 104 may have an air gap.

FIG. 3A to FIG. 3G are schematic cross-sectional views illustrating a manufacturing process of a semiconductor device according to an embodiment of the present invention, in which the same or similar components are denoted by the same or similar reference numerals, and the descriptions of the same technical content are omitted. For example, the descriptions of the position, size, or material of each layer or region can refer to the aforesaid embodiments, and are not repeated in the following.

Figure 3A:
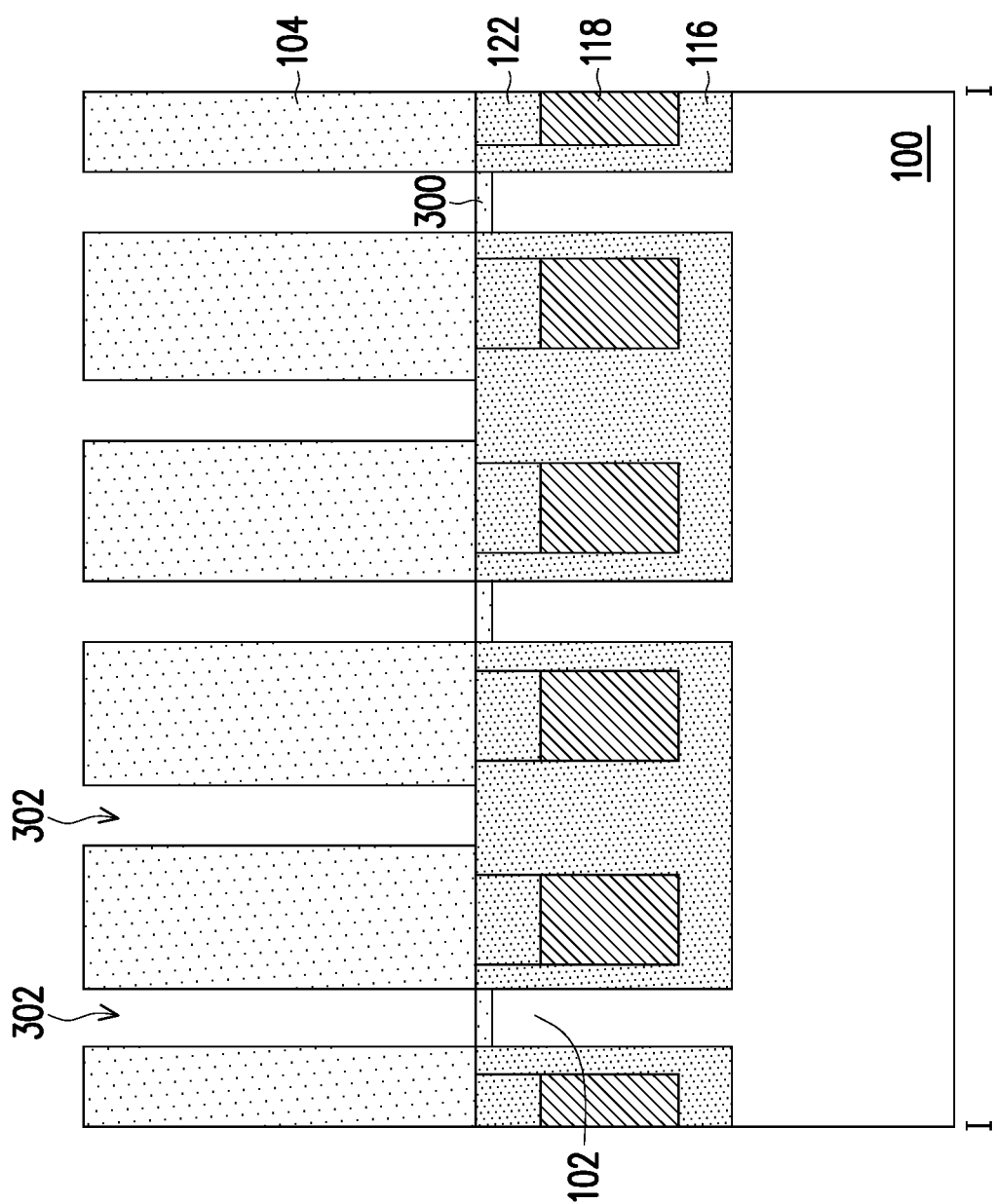
FIG. 3A to 3G are schematic cross-sectional views illustrating a manufacturing process of a semiconductor device according to an embodiment of the present invention.

Referring to FIG. 3A, a plurality of active regions 102 are first defined in a substrate 100. For example, an isolation structure 116 is formed in the substrate 100 to define the active regions 102. And, if the memory device is taken as an example, after the isolation structure 116 is formed, a plurality of buried word lines 118 may be subsequently formed, and a protective layer 300 may be formed on the substrate 100 to protect the surface of the substrate 100 from being affected by the etching process performed in the previous process of manufacturing the isolation structure 116, and to serve as a stop layer for subsequent etching processes. Next, at least one dielectric layer 104 is formed on the substrate 100, and a plurality of openings 302 are formed in the dielectric layer 104. In one embodiment, each of the openings 302 has substantially the same diameter. The method of forming the openings 302 includes, for example, a lithography and etching process or a SADP process.

Figure 3B:
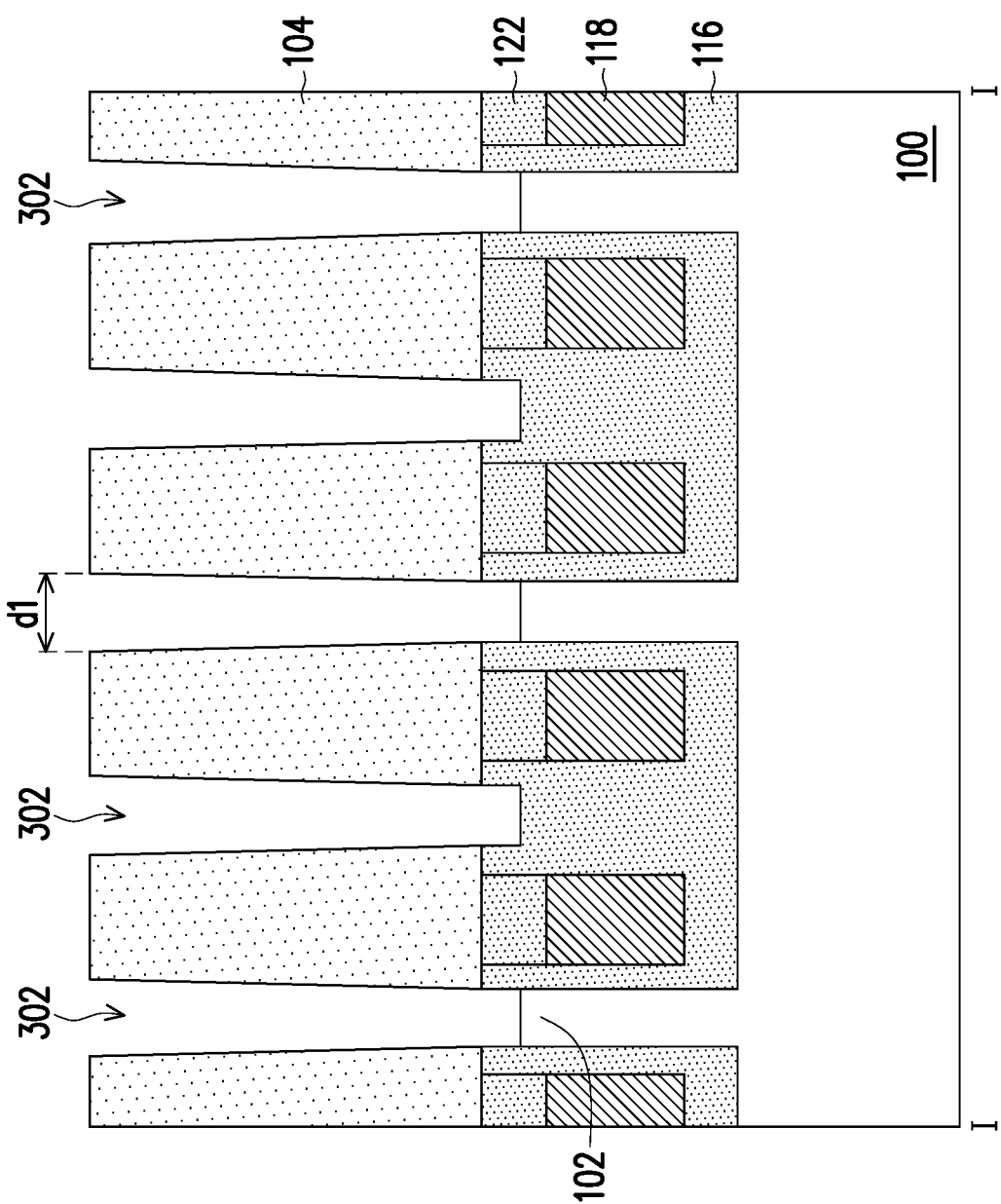

After that, referring to FIG. 3B, the protective layer 300 on the surface of the substrate 100 is removed to expose the active regions 102. The method of removing protective layer 300 includes wet etching or dry etching, for example. If the protective layer 300 is not provided or the protective layer 300 has been removed in the previous step, this step is not required.

Figure 3C:
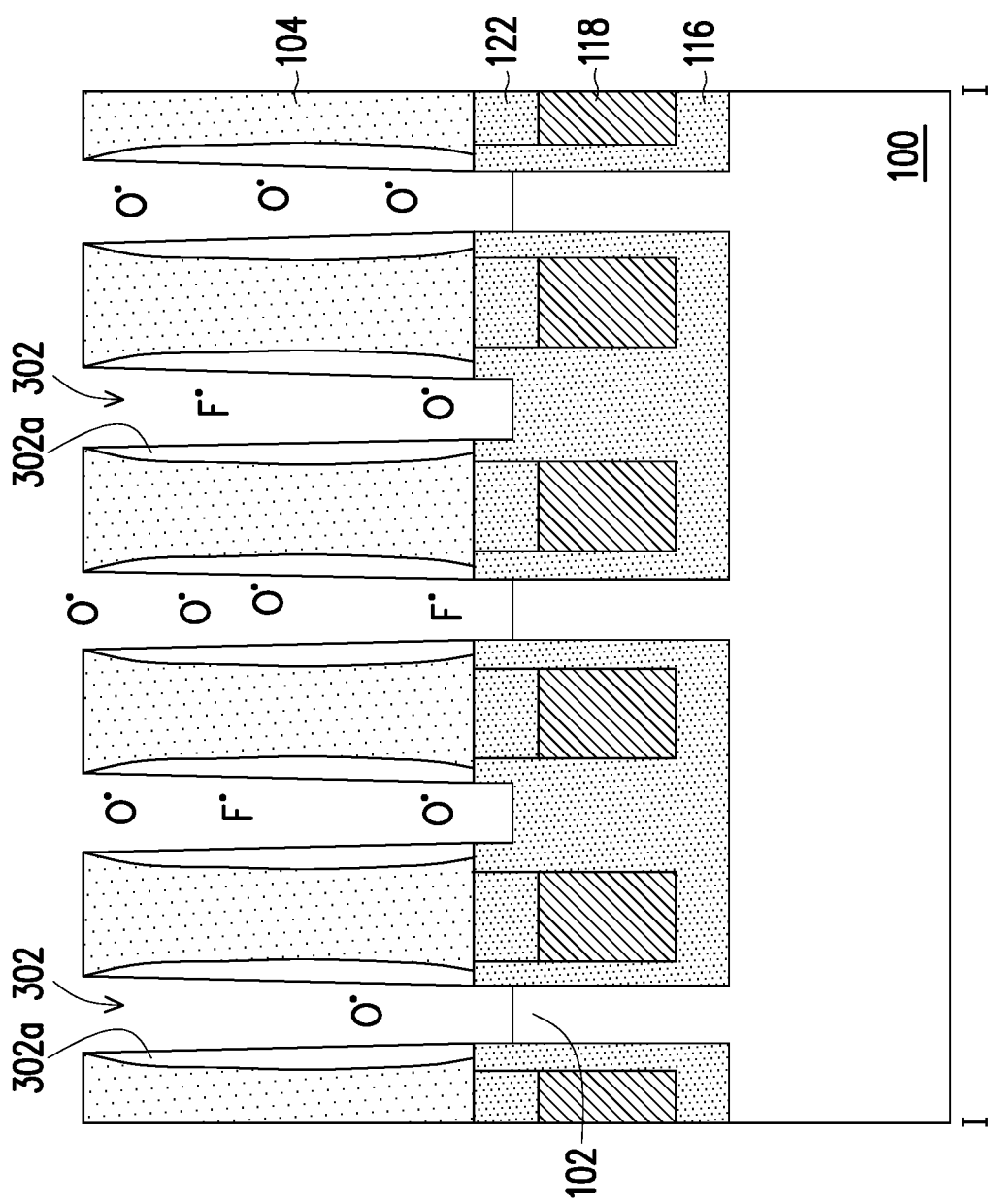

Then, referring to FIG. 3C, if the material of the dielectric layer 104 is silicon nitride, a first oxygen plasma and a first fluorine plasma are first introduced to remove by-products in the openings 302 and oxidize the inner surfaces 302a of the openings 302. In some embodiments, the gas generating the first oxygen plasma includes oxygen having a flow rate of 1000 sccm to 3000 sccm, the gas generating the first fluorine plasma includes $CF_4$ gas having a flow rate of 10 sccm to 50 sccm, the process pressure ranges from 10 mT to 1000 mT, and the power ranges from 500 W to 2000 W.

Figure 3D:
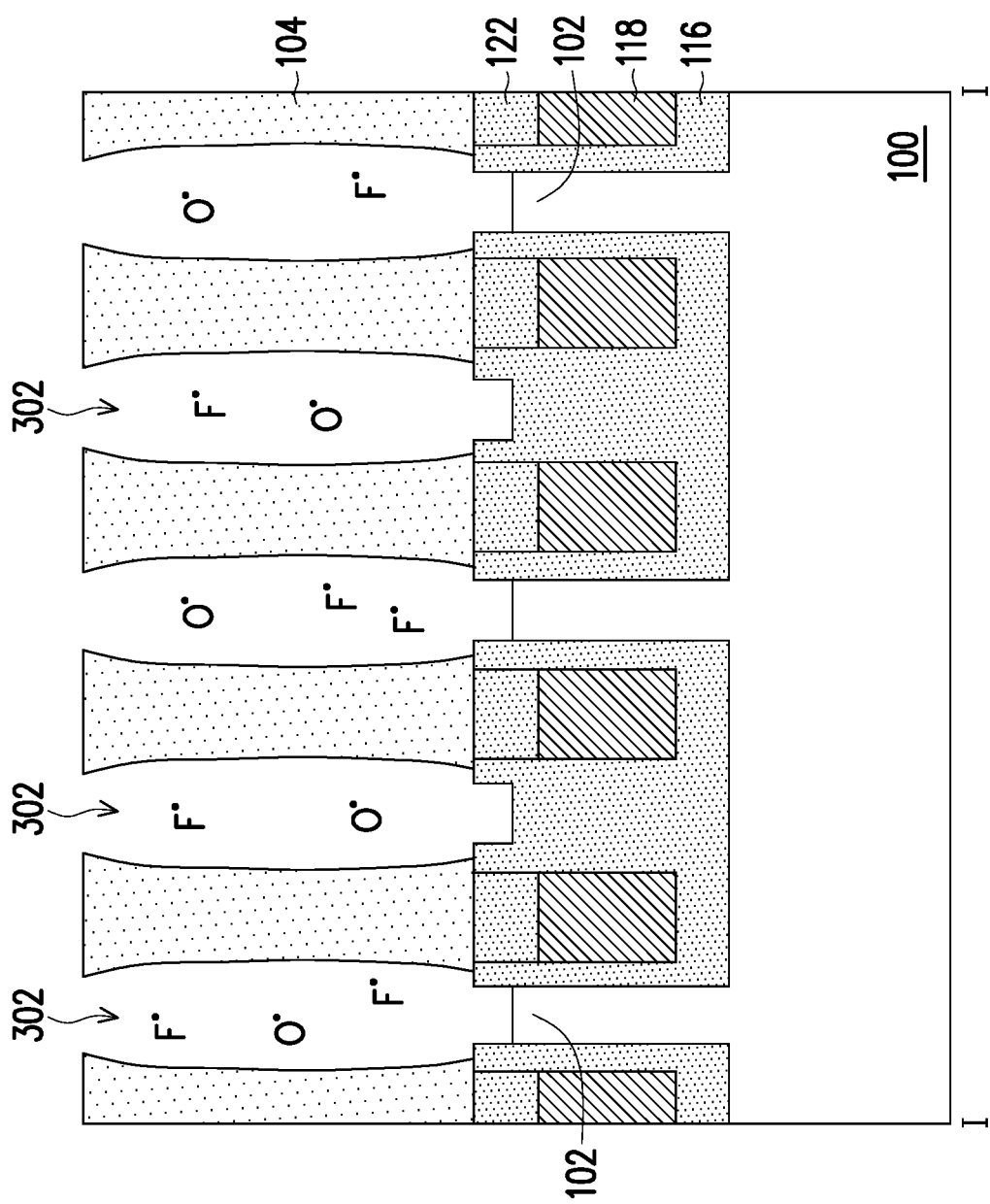

Then, referring to FIG. 3D, a second oxygen plasma and a second fluorine plasma are introduced to remove the oxidized inner surfaces 302a (shown in FIG. 3C) for enlarging the openings 302 and to repair the active regions 102 at the same time, in which the flow rate of the gas generating the second fluorine plasma may be greater than the flow rate of the gas generating the first fluorine plasma. In some embodiments, the gas generating the second oxygen plasma includes oxygen with a flow rate of 1000 sccm to 3000 sccm, the gas generating the second fluorine plasma includes $CF_4$ gas with a flow rate of 50 sccm to 200 sccm, the process pressure ranges from 10 mT to 1000 mT, and the power ranges from 500 W to 2000 W.

Figure 3E:
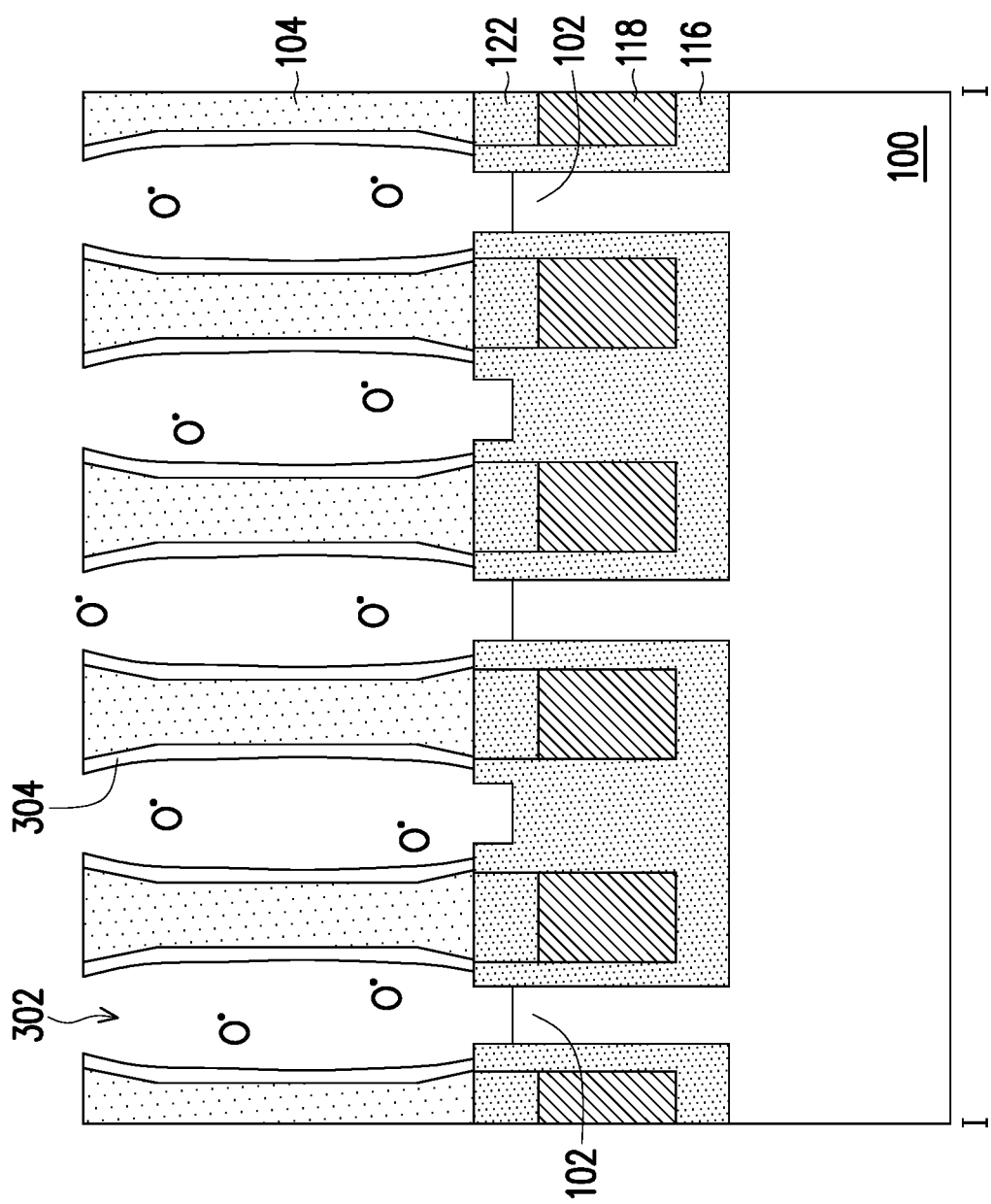

Next, referring to FIG. 3E, a third oxygen plasma is introduced to oxidize the inner surfaces of the enlarged openings 302 to form an oxide layer 304. In some embodiments, the gas generating the third oxygen plasma includes oxygen having a flow rate of 50 sccm to 3000 sccm, the process pressure ranges from 10 mT to 1000 mT, and the power ranges from 500 W to 2000 W.

The above-mentioned conditions for generating the first oxygen plasma, the first fluorine plasma, the second oxygen plasma, the second fluorine plasma, and the third oxygen plasma are not used to limit the embodiments of the present invention. For example, the gas for generating the second fluorine plasma may be other gases, such as $NF_3$, or $CH_2F_2$. In principle, if the same gases are used, the flow rate of the gas generating the first oxygen plasma is close to or substantially equal to the flow rate of the gas generating the second oxygen plasma, and the flow rate of the gas generating the second fluorine plasma is greater than the flow rate of the gas generating the first fluorine plasma.

Figure 3F:
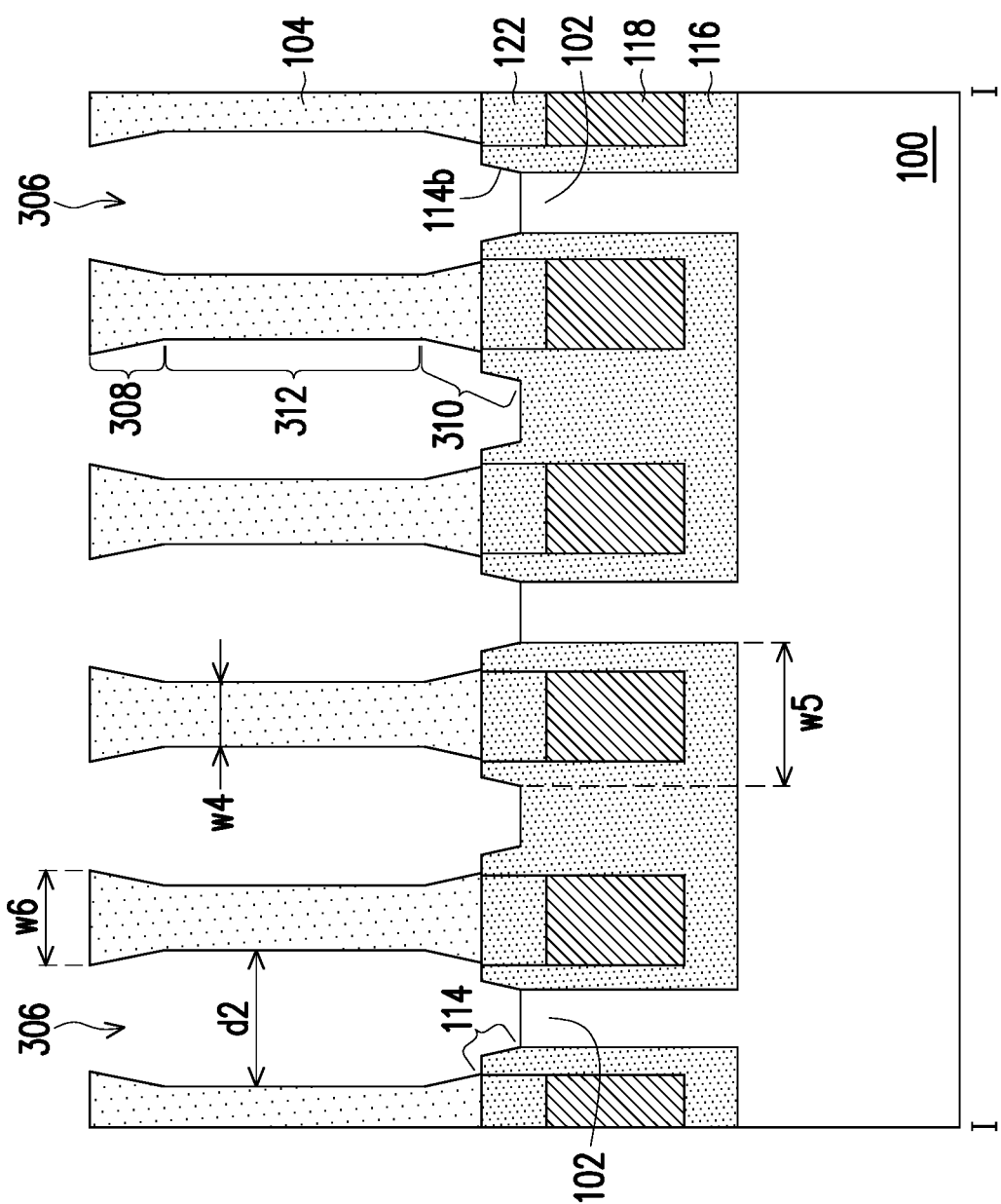

Then, referring to FIG. 3F, the oxide layer 304 as shown in FIG. 3E is removed to form a plurality of contact holes 306. The method of removing the oxide layer 304 includes wet etching, for example. The cross-sectional structure of two adjacent contact holes 306 includes a capital 308, a base 310, and a shaft 312 between the capital 308 and the base 310, the width w4 of the shaft 312 is smaller than the width w5 of the base 310, and the width w4 of the shaft 312 is also smaller than the width w6 of the column capital 308. In some embodiments, the diameter d2 of each contact hole 306 is, for example, 1.05 times to 2 times the diameter d1 of each opening 302 (shown in FIG. 3B), i.e. 1+[(d2−d1)/d1]. The "diameter" in the text generally refers to the diameter of the widest part. In addition, each contact hole 306 has a stepped cross section 114 between the base 310 and the shaft 312, where the sidewall 114b of the stepped cross section 114 may be a tapered sidewall due to the influence of the above-mentioned wet etching. Since the contact hole 306 is larger than the conventional opening generally formed by a lithographic etching process or a SADP process, even if there is some alignment error generated from the aforementioned processes, it will not affect the contact area between the subsequently formed contact and the active region 102.

Figure 3G:
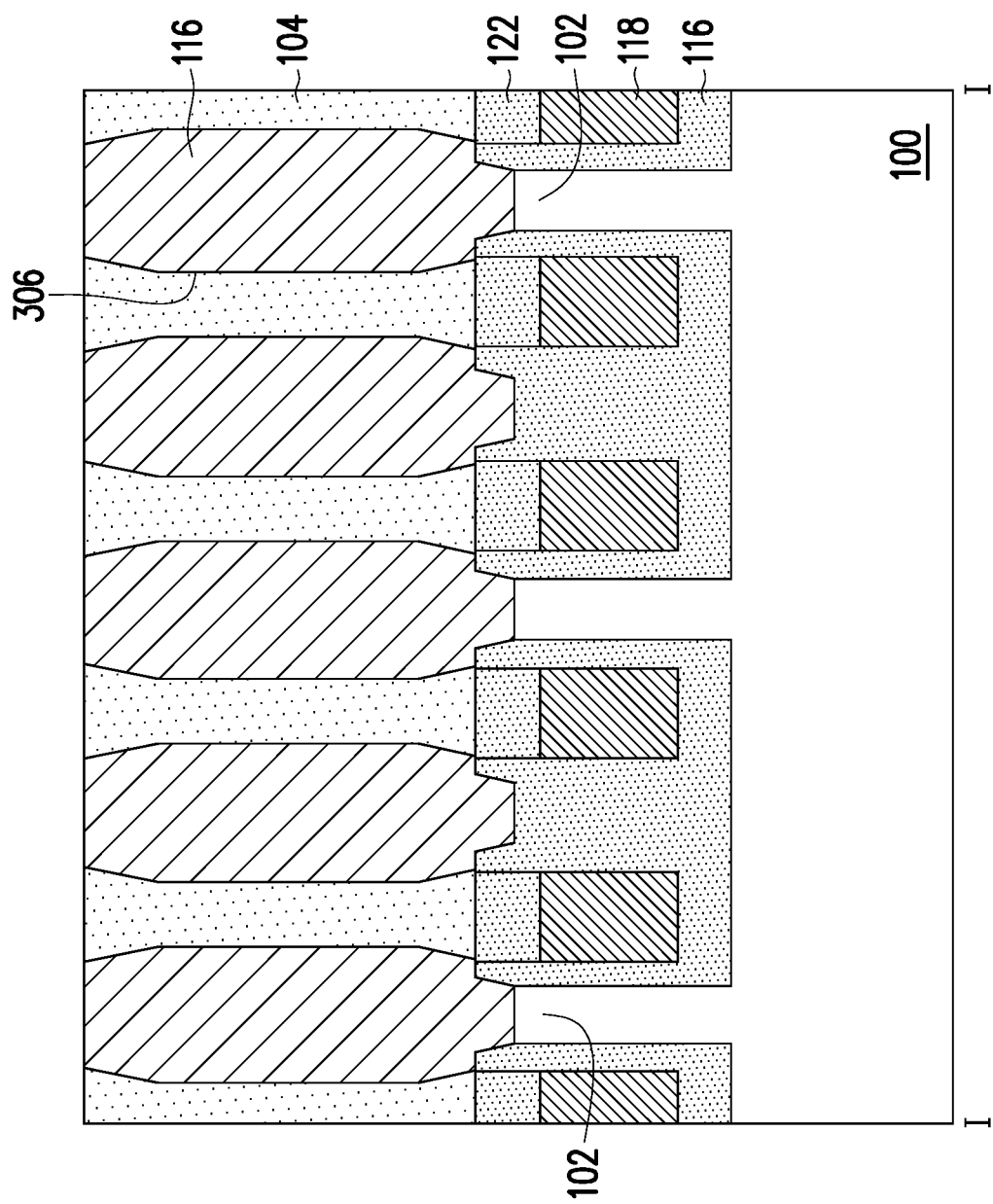

Next, referring to FIG. 3G, a conductive material is deposited on the substrate 100 and fills the contact holes 306, and then the conductive material is planarized to form a plurality of contacts 106 in the contact holes 306. In some embodiments, the conductive material includes doped or undoped polycrystalline silicon, titanium nitride, tungsten, the like, or a combination thereof. The method of planarizing the conductive material includes chemical mechanical polishing (CMP), for example.

In summary, the present invention can break through the current process limitation to form a contact with barrel-shaped structure through a series of specific processes, and thus increase the contact area between the contact and the active region, thereby improving the electrical characteristic.

Although the present invention has been disclosed as above by way of example, it is not intended to limit the present invention. Any person with ordinary knowledge in the technical field can make some changes and decorations without departing from the spirit and scope of the present invention. Therefore, the scope of protection of the present invention shall be determined by the scope of the attached patent application.

What is claimed is:

1. A method for manufacturing a semiconductor device, comprising:
    defining a plurality of active regions in a substrate;
    forming at least one dielectric layer on the substrate;
    forming a plurality of openings in the at least one dielectric layer and exposing the plurality of active regions;
    introducing a first oxygen plasma and a first fluorine plasma to remove by-products in the plurality of openings and oxidize inner surfaces of the plurality of openings;
    introducing a second oxygen plasma and a second fluorine plasma to remove the oxidized inner surfaces for enlarging the plurality of openings and to repair the plurality of active regions;
    introducing a third oxygen plasma to oxidize inner surfaces of the enlarged plurality of openings to form an oxide layer;
    removing the oxide layer to form a plurality of contact holes, wherein a cross-sectional structure of two adjacent contact holes comprises a capital, a base, and a shaft between the capital and the base, and a width of the shaft is smaller than a width of the base and smaller than a width of the capital;
    depositing a conductive material on the substrate and filling the plurality of contact holes; and
    planarizing the conductive material to form a plurality of contacts in the plurality of contact holes.

2. The method of claim 1, wherein a diameter of each of the plurality of contact holes is 1.05 to 2 times a diameter of each of the plurality of openings.

3. The method of claim 1, wherein a flow rate of a gas for generating the second fluorine plasma is greater than a flow rate of a gas for generating the first fluorine plasma.

4. The method of claim 1, wherein a gas generating the first oxygen plasma comprises oxygen having a flow rate of 1000 sccm to 3000 sccm and a gas generating the first fluorine plasma comprises $CF_4$ gas with a flow rate of 10 sccm to 50 sccm.

5. The method of claim 1, wherein a gas generating the second oxygen plasma comprises oxygen having a flow rate of 1000 sccm to 3000 sccm and a gas generating the second fluorine plasma comprises $CF_4$ gas with a flow rate of 50 sccm to 200 sccm.

6. The method of claim 1, wherein a gas generating the third oxygen plasma comprises oxygen having a flow rate of 50 sccm to 3000 sccm.

7. The method of claim 1, wherein each of the plurality of contact holes has a stepped cross section between the base and the shaft.

8. The method of claim 1, wherein a method for removing the oxide layer comprises wet etching.

9. The method of claim 1, wherein a method for forming the plurality of openings comprises a lithography and etching process or a self-alignment double patterning (SADP) process.

10. The method of claim 1, wherein the conductive material comprises doped or undoped polycrystalline silicon, titanium nitride, tungsten, or a combination thereof.

11. The method of claim 1, wherein the step of defining the plurality of active regions in the substrate comprises forming a plurality of isolation structures in the substrate to define the plurality of active regions.

12. The method of claim 11, wherein after defining the plurality of active regions in the substrate, further comprising forming a plurality of buried word lines penetrating a part of the plurality of isolation structures.

13. The method of claim 1, wherein each of the contacts is a barrel-shaped structure, the barrel-shaped structure has a middle portion, a head portion, and an end portion, wherein a perimeter of the head portion is smaller than a perimeter of the middle portion, and a perimeter of the end portion is smaller than the perimeter of the middle portion.

14. The method of claim 1, wherein after planarizing the conductive material to form the plurality of contacts, further comprising forming a plurality of capacitor structures above and connected with the plurality of contacts.

* * * * *